United States Patent
Chen et al.

(10) Patent No.: US 11,766,703 B2
(45) Date of Patent: Sep. 26, 2023

(54) APPARATUS AND METHOD FOR WAFER CLEANING

(71) Applicant: Taiwan Semiconductor Manufacturing Co., Ltd., Hsinchu (TW)

(72) Inventors: Bo Chen Chen, Hsinchu (TW); Sheng-Wei Wu, Zhubei (TW); Yung-Li Tsai, Houlong Town (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/532,701

(22) Filed: Aug. 6, 2019

(65) Prior Publication Data
US 2020/0055099 A1    Feb. 20, 2020

Related U.S. Application Data
(60) Provisional application No. 62/764,651, filed on Aug. 15, 2018.

(51) Int. Cl.
| | | |
|---|---|---|
| *B08B 7/04* | (2006.01) | |
| *B08B 1/00* | (2006.01) | |
| *B08B 1/02* | (2006.01) | |
| *B08B 3/04* | (2006.01) | |
| *H01L 21/67* | (2006.01) | |
| *H01L 21/02* | (2006.01) | |

(Continued)

(52) U.S. Cl.
CPC .............. *B08B 7/04* (2013.01); *A46B 13/023* (2013.01); *B08B 1/002* (2013.01); *B08B 1/02* (2013.01); *B08B 3/041* (2013.01); *H01L 21/02057* (2013.01); *H01L 21/67046* (2013.01); *H01L 21/67051* (2013.01); *B08B 1/04* (2013.01)

(58) Field of Classification Search
None
See application file for complete search history.

(56) References Cited

U.S. PATENT DOCUMENTS

| | | | | |
|---|---|---|---|---|
| 4,935,981 A | * | 6/1990 | Ohtani | .............. H01L 21/67046 451/280 |
| 2003/0111095 A1 | * | 6/2003 | Sugarman | ......... H01L 21/67046 134/6 |
| 2008/0006296 A1 | | 1/2008 | Nagata et al. | |

(Continued)

FOREIGN PATENT DOCUMENTS

| | | |
|---|---|---|
| CN | 101879699 A | 10/2010 |
| CN | 206541806 U | 10/2017 |

(Continued)

*Primary Examiner* — Mikhail Kornakov
*Assistant Examiner* — Pradhuman Parihar
(74) *Attorney, Agent, or Firm* — Sterne, Kessler, Goldstein & Fox P.L.L.C.

(57) ABSTRACT

The present disclosure relates to an apparatus and a method for wafer cleaning. The apparatus can include a wafer holder configured to hold a wafer; a cleaning nozzle configured to dispense a cleaning fluid onto a first surface (e.g., front surface) of the wafer; and a cleaning brush configured to clean a second surface (e.g., back surface) of the wafer. Using the cleaning fluid, the cleaning brush can clean the second surface of the wafer with a scrubbing motion and ultrasonic vibration.

20 Claims, 4 Drawing Sheets

(51) Int. Cl.
    *A46B 13/02*     (2006.01)
    *B08B 1/04*     (2006.01)

(56) References Cited

U.S. PATENT DOCUMENTS

| | | | |
|---|---|---|---|
| 2010/0258143 A1* | 10/2010 | Williams | H01L 21/02065 134/6 |
| 2013/0074872 A1* | 3/2013 | Yeh | H01L 21/67051 134/6 |
| 2014/0310895 A1* | 10/2014 | Chen | H01L 21/67046 318/9 |
| 2016/0071745 A1* | 3/2016 | Kim | H01L 21/67115 134/105 |
| 2017/0018422 A1* | 1/2017 | Patel | H01L 21/02096 |
| 2017/0092481 A1* | 3/2017 | Huang | B08B 1/002 |
| 2017/0119144 A1* | 5/2017 | Brewer | A46B 13/008 |
| 2017/0221696 A1* | 8/2017 | Nishiyama | H01L 21/67051 |
| 2017/0320188 A1 | 11/2017 | Kweon et al. | |
| 2018/0334318 A1* | 11/2018 | Cho | C08L 65/00 |

FOREIGN PATENT DOCUMENTS

| | | | |
|---|---|---|---|
| KR | 20160027638 A | 3/2016 | |
| TW | 200539961 A | 12/2005 | |

\* cited by examiner

APPARATUS AND METHOD FOR WAFER CLEANING

RELATED APPLICATION

This application claims the benefit of U.S. Provisional Patent Application No. 62/764,651, filed Aug. 15, 2018, titled "Apparatus and Method for Wafer Cleaning," which is incorporated by reference herein in its entirety.

BACKGROUND

Cleaning semiconductor wafers (e.g., silicon wafers) is an operation performed in the manufacturing process of semiconductor devices and microelectromechanical systems (MEMS). An objective of the wafer cleaning process is to remove chemical and particle impurities without altering or damaging a wafer's surface or substrate. Semiconductor wafer yield is inversely related to defect density (e.g., cleanliness and particle count) from wafer processing. In other words, a lower defect density results in higher semiconductor wafer yield.

BRIEF DESCRIPTION OF THE DRAWINGS

Aspects of the present disclosure are best understood from the following detailed description when read with the accompanying figures. In accordance with the common practice in the industry, various features are not drawn to scale. In fact, the dimensions of the various features can be arbitrarily increased or reduced for clarity of illustration and discussion.

DETAILED DESCRIPTION

Figure 1:
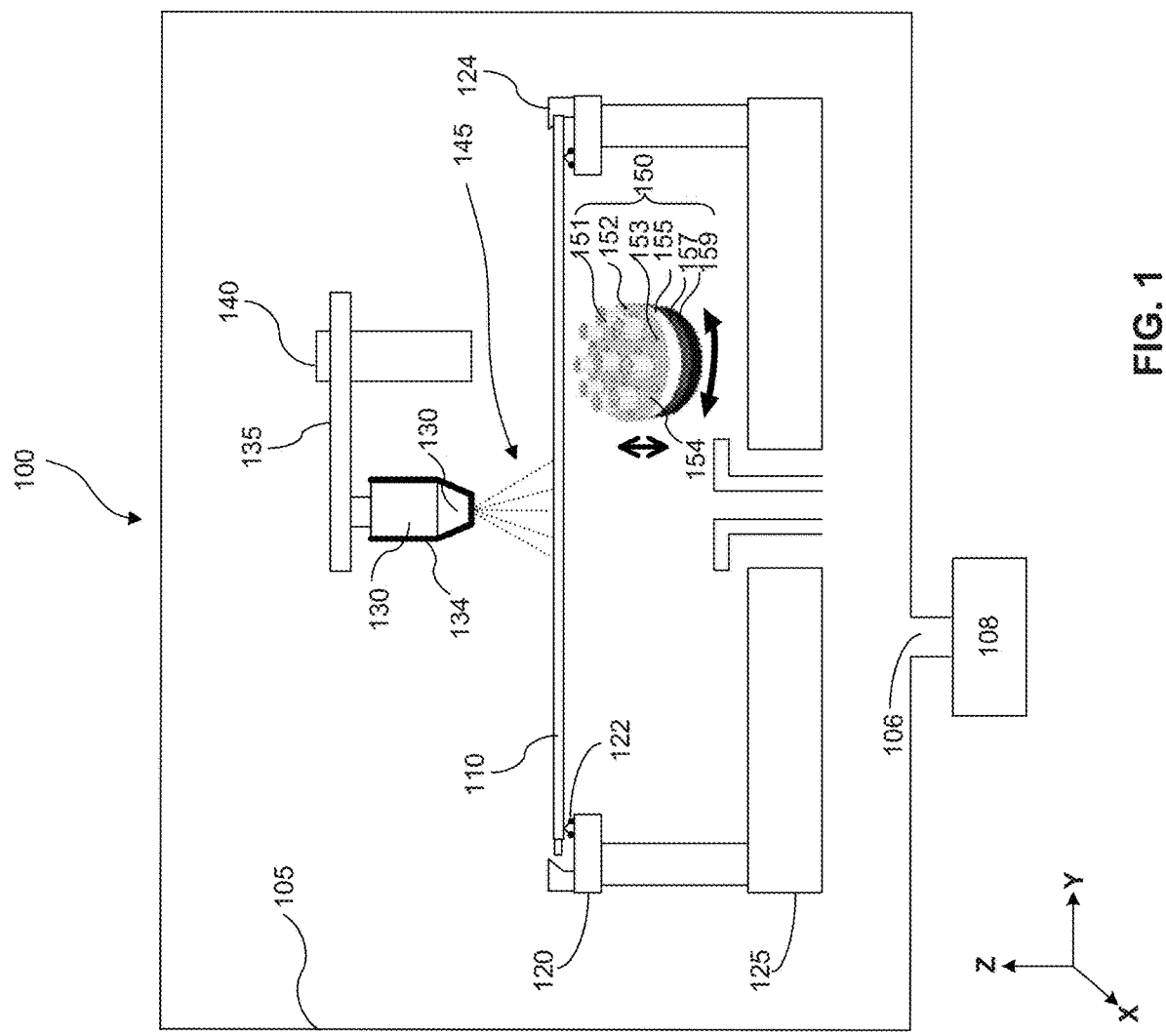
FIG. 1 is a diagram of an exemplary wafer cleaning apparatus, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows can include embodiments in which the first and second features are formed in direct contact, and can also include embodiments in which additional features are disposed between the first and second features, such that the first and second features are not in direct contact. In addition, the present disclosure can repeat reference numerals and/or letters in the various examples. This repetition does not in itself dictate a relationship between the various embodiments and/or configurations discussed.

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "horizontal," as used herein, means normally parallel to a level ground.

The term "vertical," as used herein, means nominally perpendicular to a level ground.

In some embodiments, the terms "about" and "substantially" can indicate a value of a given quantity that varies within 5% of the value (e.g., ±1%, ±2%, ±3%, ±4%, ±5% of the value).

Wafer cleaning is a process to remove contamination introduced during the semiconductor fabrication process. The contamination can include organics (e.g., organic byproducts), metallics (traces of metals), and native oxides. The wafer cleaning process includes dry cleaning methods, wet cleaning methods, or a combination thereof. Further, the wafer cleaning process can be performed in wet tools, which can handle either batches of wafers (e.g., in a bath) or a single wafer at a time (e.g., "single-wafer" tools).

For example, in a single-wafer tool, the wafer enters a cleaning module and is positioned on a wafer stage. The wafer is then subjected to a wafer cleaning process via one or more nozzles positioned above the wafer's surface. The one or more nozzles can flow chemicals (e.g., a chemical solution, deionized water, etc.) under pressure on the wafer's surface to remove contamination. After the wafer cleaning process, the wafer can be dried (e.g., via spinning) and released from the wet cleaning tool.

This disclosure is directed to an apparatus and a method for wafer cleaning that uses a cleaning brush to clean a back surface (e.g., backside) of the wafer. With a cleaning fluid, the brush cleans the back surface of the wafer with a scrubbing motion and ultrasonic vibration. Such apparatus and method improves the removal of the defects from the wafer.

FIG. 1 is a diagram of an exemplary wafer cleaning apparatus 100, in accordance with some embodiments. Wafer cleaning apparatus 100 can include a wafer holder 120, a cleaning nozzle 130, and a cleaning brush 150. In some embodiments, wafer cleaning apparatus 100 can include an enclosure 105 configured to enclose wafer holder 120, cleaning nozzle 130, and cleaning brush 150. In some embodiments, the z-direction in FIG. 1 can be along a gravitational direction of an environment where wafer cleaning apparatus 100 is located.

In some embodiments, enclosure 105 can form an inner space (or a chamber) of wafer cleaning apparatus 100 in which the wafer cleaning is performed. In some embodiments, enclosure 105 can include vertical walls (e.g., along the z-axis), a ceiling (e.g., along the x-axis and y-axis), and a floor (e.g., along the x-axis and y-axis and below the ceiling). In some embodiments, one or more openings 106 can be made in one or more of the vertical walls, ceiling, and floor to install units for gas exchange, e.g., sucking air or expelling exhaust. A noncombustible material can be used to form enclosure 105 to avoid flammability. The noncombustible material can include, but is not limited to, ethylene chlorotrifluoroethylene (ECTFE), polyvinylidene fluoride (PVDF), perfluoroalkoxy alkane (PFA), or a combination thereof.

Wafer cleaning apparatus 100 can include wafer holder 120 configured to hold (or secure) a wafer 110 inside enclosure 105. In some embodiments, wafer holder 120 can further include a heating plate (not shown in FIG. 1) configured to heat wafer 110 during the wafer cleaning process to enhance the cleaning efficiency. Wafer holder 120 can also include multiple support pins 122 and multiple clamp pins 124 to hold wafer 110 and prevent wafer 110 from sliding during the wafer cleaning process. In some embodiments, wafer holder 120 can include a six-pin design with three additional support pins (e.g., clamp pins, not shown in FIG. 1) to reduce wafer slide during wafer cleaning. In some embodiments, an inner flow system (not shown in FIG. 1) can be operatively coupled to wafer holder 120 and configured to introduce gas flow to wafer 110 during the wafer cleaning process to facilitate the removal of cleaning fluids. Wafer holder 120 can be further attached to a spin base 125. In some embodiments, wafer holder 120 can spin wafer 110 via spin base 125, which spins wafer 110 at different speeds during the wafer cleaning process. In some embodiments, wafer holder 120 can be configured to hold (or secure) the wafer horizontally (e.g., along the x-y plane) or vertically (e.g., along the x-z plane) during the wafer cleaning process.

Wafer cleaning apparatus 100 can include a cleaning nozzle 130 configured to supply a flow of (or dispense) a cleaning fluid 145 onto a front surface of wafer 110. As used herein, the front surface of wafer 110 refers to a major surface on which semiconductor device(s) can be formed. When wafer 110 is held onto wafer holder 120, the front surface faces towards the ceiling (e.g., in the z-direction) of enclosure 105. Cleaning nozzle 130 can be configured to supply a flow of (or dispense) cleaning fluid 145 onto the front surface of wafer 110 at a preset amount onto the front surface of wafer 110. In some embodiments, cleaning nozzle 130 can be a pressure nozzle configured to rinse the wafer. Cleaning nozzle 130 can be attached to a nozzle arm 135, which can pivot around a spindle 140 during the wafer cleaning process. In some embodiments, wafer cleaning apparatus 100 can be equipped with more than one cleaning nozzle 130 depending on the design of wafer cleaning apparatus 100. In some embodiments, the distance between cleaning nozzle 130 and wafer 110 can be adjusted or remain fixed for the duration of the wafer cleaning process. In some embodiments, the orientation of cleaning nozzle 130 with respect to the front surface of wafer 110 (e.g., the angle between cleaning nozzle 130 with respect to the front surface of wafer 110) can also be adjusted or remain fixed, according to some embodiments. Cleaning nozzle 130 can be connected, via one or more chemical switch boxes (not shown in FIG. 1), to external tanks (not shown in FIG. 1) with chemicals. The chemical switch boxes can be chemical distribution systems, where valves and chemical distribution lines are housed and chemical solutions are pre-mixed prior to delivery to cleaning nozzle 130. In some embodiments, cleaning nozzle 130 may or may not pivot around spindle 140 while cleaning fluid 145 is supplied (or dispensed) on wafer 110. At the same time, wafer 110 may or may not be rotated while cleaning fluid 145 is supplied (or dispensed) on wafer 110.

In some embodiments, a portion of an outer surface of cleaning nozzle 130 can be covered with a conductive layer 134 to reduce the risk of static electric charge that can occur at cleaning nozzle 130 during the wafer cleaning process. In some embodiments, cleaning nozzle 130 can be made of polychlorotrifluoroethylene (PCTFE) and/or polytetrafluoroethylen (PTFE), which have static electricity values (e.g., −4.58 kV for PCTFE) that can increase the risk of static electric charge during the operation of cleaning nozzle 130. By coating a portion of the outer surface of cleaning nozzle 130 with conductive layer 134, such as a conductive material with static electricity higher than about −4 kV (e.g., higher than about −4 kV, about −3.5 kV, about −3 kV, about −2.5 kV, about −2 kV, about −1.5 kV, or about −1 kV), the risk of static electric charge can be reduced. In some embodiments, conductive layer 134 can include carbon nanotubes with a carbon doping of about between 0.025 weight (wt) % and about 0.1 wt % (e.g., between 0.025 wt % and 0.1 wt %, between 0.03 wt % and 0.09 wt %, between 0.04 wt % and 0.08 wt %, or between 0.05 wt % and 0.07 wt %). In some embodiments, an additional grounding unit (not shown in FIG. 1), such as a grounding plate or a conductive wire connecting to an external ground level, can be coupled to cleaning nozzle 130 to further reduce the risk of static electric charge. In some embodiments, cleaning nozzle 130 can further include an ionizer (not shown in FIG. 1) configured to supply corona discharges to cleaning nozzle 130 to reduce the static electric charge. Corona discharges can be electrical discharges generated by an ionization of a fluid, such as air, surrounding a conductor (e.g., conductive layer 134 coated on the outer surface of cleaning nozzle 130) that is electrically charged.

Cleaning fluid 145 can include, but is not limited to, hydrofluoric acid, hydrochloric acid, sulfuric acid, hydrogen peroxide, ammonium hydroxide, acetone, methanol, isopropyl alcohol, deionized water (DI water), or a combination thereof. In some embodiments, cleaning fluid 145 can be a solution including, but is not limited to, a hydrochloric acid/hydrogen peroxide/DI water (HPM) solution, a sulfuric acid/hydrogen peroxide/DI water (SPM) solution, a hydrochloric acid/ozone/DI water (HOM) solution, a sulfuric acid/ozone/DI water (SOM) solution, an ammonium hydroxide/ozone/DI water (AOM) solution, a hydrofluoric acid/DI water (DHF) solution, an ozone solution (ozone diluted in DI water), or a combination thereof. One or more cleaning fluids can be supplied on the wafer successively and independently from one another at different stages of the wafer cleaning process. For example, an exemplary wafer cleaning process can include a DHF operation and an HPM operation with another cleaning operation in between. Depending on the specific cleaning fluid(s) used for wafer cleaning, the heating plate of wafer holder 120 can heat wafer 110 to a suitable temperature. For example, for isopropyl alcohol, wafer 110 can be heated to from about 190° C. to about 195° C. for about 30 seconds to boil the isopropyl alcohol. In some embodiments, the heating plate of wafer holder 120 can heat wafer 110 to from about 75° C. to about 85° C. for about 10 minutes to boil the ammonium hydroxide/hydrogen peroxide/DI water (e.g., SC1 clean). In some embodiments, the heating plate of wafer holder 120 can heat wafer 110 to from about 75° C. to about 85° C. for about 10 minutes to boil the hydrochloric acid/hydrogen peroxide/DI water (e.g., SC2 clean).

Wafer cleaning apparatus 100 can include a cleaning brush 150 configured to clean a back surface (e.g., backside) of wafer 110. The back surface (e.g., backside) of wafer 110 refers to a surface opposite to the front surface of wafer 110—e.g., a surface opposite to a major surface of wafer 110 on which semiconductor device(s) are formed. In some embodiments, cleaning brush 150 can include a plurality of bristles 151 configured to scrub wafer 110; a brush body 152 configured to carry (or secure) the plurality of bristles 151; a plurality of spray outlets 153 configured to supply (or dispense) a cleaning fluid onto the back surface of wafer 110; and an ultrasonic emitter 155 configured to ultrasonically vibrate cleaning brush 150. In some embodiments, cleaning brush 150 can also include a pressure sensor 157 configured to detect the pressure applied to cleaning brush 150 against wafer 110, and a location sensor 159 configured to track a location of cleaning brush 150 against wafer 110. In some embodiments, wafer cleaning apparatus 100 can further include a motion mechanism (e.g., not shown in FIG. 1) to control a translational or rotational movement of cleaning brush 150. In some embodiments, the motion mechanism can be configured to press cleaning brush 150 to provide the pressure against wafer 110. In some embodiments, the motion mechanism can include a robotic arm (not shown in FIG. 1) or a motion stage (not shown in FIG. 1).

In some embodiments, plurality of bristles 151 can be arranged in a plurality of bristle clusters (e.g., 9 clusters as shown in FIG. 1). The number of bristle clusters can be any number larger than or equal to 1. For example, the number of bristle clusters can be between about 2 and about 30. In some embodiments, the number of bristle clusters can range from about 1 to about 30, according to some embodiments of the present disclosure. In some embodiments, each bristle cluster can include multiple bristles 151 having the same length, diameter, hardness, and/or material. In some embodiments, each bristle cluster can include multiple bristles 151 with different lengths to scrub an uneven or warped regions (not shown in FIG. 1) of wafer 110. For example, each bristle cluster can include a first group of bristles $151_1$ (shown in FIG. 2) and a second group of bristles $151_2$ (shown in FIG. 2), where a length of the bristles in first group of bristles $151_1$ can be longer than that of second group of bristles $151_2$. Such bristle cluster with various length of bristles 151 can conformally contact an uneven or warped surface of wafer 110, thus enhancing a cleaning efficiency of cleaning brush 150. In some embodiments, each bristle cluster can include first group of bristles $151_1$ and second group of bristles $151_2$, where first group of bristles $151_1$ can be interleaved with second group of bristles $151_2$. In some embodiments, each bristle cluster can include first group of bristles $151_1$ and second group of bristles $151_2$, where first group of bristles $151_1$ can surround second group of bristles $151_2$. Based on the disclosure herein, other lengths and placements of bristles 151 (e.g., $151_1$ and $151_2$) on brush body 152 are within the scope and spirit of this disclosure. In some embodiments, each bristle 151 can have a diameter between about 0.08 mm and about 1 mm. In some embodiments, each bristle 151 can have a length between about 5 mm and about 8 mm. In some embodiments, the material of plurality of bristles 151 can include, but is not limited to, polyethylene terephthalate (PET), polypropylene (PP), polyvinyl chloride (PVC), polyamide (PA), or a combination thereof. In some embodiments, each bristle cluster can include multiple bristles 151 with different length, diameter, hardness, and/or material.

In some embodiments, brush body 152 can have a drum or a disk shape. Brush body 152 can be coupled to a rotating shaft, which applies a rotational force from a rotation unit to brush body 152. The rotation unit can include a motor, with one or more drive pulleys and a belt for applying the rotational force of the motor to the rotation shaft. Materials for brush body 152 can be wear-resistant materials, including, but is not limited to, polyoxymethylene (POM), polyethylene (PE), polypropylene (PP), polyvinyl chloride (PVC), polyethylene terephthalate (PET or PETE), polystyrene (Styrofoam), polytetrafluoroethylene (Teflon), polyvinylidine chloride (Saran), or a combination thereof. Brush body 152 can have a diameter between about 20 mm and about 40 mm (e.g., about 30 mm). In some embodiments, plurality of bristles 151 can be embedded to a depth of about 1 mm to about 3 mm (e.g., about 2 mm) into brush body 152.

In some embodiments, cleaning brush 150 can include a plurality of spray outlets 153 configured to supply a cleaning fluid onto wafer 110 (e.g., the back surface or backside of wafer 110) during the wafer cleaning process. Plurality of spray outlets 153 can be embedded in brush body 152. The number of spray outlets 153 can be in the range from about 1 to about 30. In some embodiments, a portion of an outer surface of spray outlets 153 can be covered with a conductive layer 154 to reduce the risk of static electric charge. In some embodiments, materials for spray outlets 153 can include polychlorotrifluoroethylene (PCTFE) and/or polytetrafluoroethylen (PTFE), which have static electricity values (e.g., −4.58 kV for PCTFE) that can increase the risk of static electric charge during the operation of spray outlets 153. By coating a portion of the outer surface of spray outlets 153 with conductive layer 154, such as a conductive material with static electricity higher than about −4 kV (e.g., higher than −4 kV, −3.5 kV, −3 kV, −2.5 kV, −2 kV, −1.5 kV, or −1 kV), the risk of static electric charge can be reduced. In some embodiments, conductive layer 154 can be carbon nanotubes with a carbon doping between about 0.025 weight (wt) % and about 0.1 wt % (e.g., between 0.025 wt % and 0.1 wt %, between 0.03 wt % and 0.09 wt %, between 0.04 wt % and 0.08 wt %, or between 0.05 wt % and 0.07 wt %). In some embodiments, an additional grounding unit (not shown in FIG. 1) can be coupled to spray outlets 153 to further reduce the risk of static electric charge. The cleaning fluid supplied by spray outlets 153 can include, but not limited to, hydrofluoric acid, hydrochloric acid, sulfuric acid, hydrogen peroxide, ammonium hydroxide, acetone, methanol, isopropyl alcohol, deionized water (DI water), or a combination thereof. In some embodiments, the cleaning fluid can be a solution including, but not limited to, a hydrochloric acid/hydrogen peroxide/DI water (HPM) solution, a sulfuric acid/hydrogen peroxide/DI water (SPM) solution, a hydrochloric acid/ozone/DI water (HOM) solution, a sulfuric acid/ozone/DI water (SOM) solution, an ammonium hydroxide/ozone/DI water (AOM) solution, a hydrofluoric acid/DI water (DHF) solution, an ozone solution (ozone diluted in DI water), or a combination thereof. In some embodiments, the cleaning fluid supplied by plurality of spray outlets 153 can be the same as cleaning fluid 145 supplied by cleaning nozzle 130. The cleaning fluid supplied by plurality of spray outlets 153 can be different than cleaning fluid 145 supplied by cleaning nozzle 130. The choice of cleaning fluids can be determined by contaminants on the surface of wafer 110. By way of example and not limitation, the HPM mixture is an acidic solution capable of removing metals from the surface of the wafer. More specifically, the HPM can be a solution with high oxidation potential (e.g., higher than about 1.3 V) and low pH (e.g., below about 7). Consequently, metal contaminants on the surface of the wafer can be ionized and dissolved in the HPM solution during the wafer cleaning process. Prior to the wafer cleaning process, one or more wafers can be randomly selected to be screened for contaminants and particles to assess the efficiency of the wafer cleaning process. The contaminants can be (i) any unwanted particles, organics, metallics, or native oxides on the wafer's surface that remaining after the wafer cleaning process, (ii) chemical traces from the wet cleaning solutions used during the wet cleaning and drying processing (e.g., water spots, acids, derivatives of ammonia, etc.), or (iii) a combination thereof.

In some embodiments, cleaning brush 150 can further include an ultrasonic emitter 155 configured to provide ultrasonic vibration. Ultrasonic emitter 155 can provide ultrasonic energy propagating into plurality of brush bristles 151 and the cleaning solution, by transducer crystals, during the wafer cleaning process. The transducer crystals can be energized by a suitable power supply and oscillate at an ultrasonic frequency in the range between about 28 kHz and about 600 kHz. The ultrasonic vibration can remove particles down to at least 0.3 micrometer in diameter, including organic and inorganic impurities, from the surface (e.g., the back surface or backside) of wafer 110. The transducer crystals can be piezoelectric crystals (e.g., lead zirconate titanate crystals or cobalt barium crystals). By way of example and not limitation, ultrasonic emitter 155 can be placed under and in contact with brush body 152. In some embodiments, ultrasonic emitter 155 can be placed under brush body 152, pressure sensor 157, and/or location sensor 159.

In some embodiments, cleaning brush 150 can further include a pressure sensor 157 configured to detect and monitor the pressure applied to cleaning brush 150 against wafer 110. Pressure sensor 157 can communicate a pressure reading to a control unit (not shown in FIG. 1) that controls the pressure applied to cleaning brush 150 against wafer 110 by controlling the movement of cleaning brush 150. For example, if the measured pressure is too large and raises concerns of wafer damage, pressure sensor 157 can send a request signal to the control unit to move cleaning brush 150 away from wafer 110, thus applying less pressure to cleaning brush 150 against wafer 110 during the wafer cleaning process. The request signal can be transmitted by a wired communication means or a wireless communication means (e.g., a radio frequency (RF) transmitter, or a Bluetooth (BT) transmitter. Pressure sensor 157 can include, but is not limited to, a piezoresistive pressure sensor, an electromagnetic pressure sensor, a capacitive pressure sensor, a piezoelectric pressure sensor, and an optical pressure sensor. In some embodiments, a pressure applied to cleaning brush 150 against wafer 110 can be between about 0.001 and about 0.05 kg/cm$^2$ during the wafer cleaning process to maintain cleaning efficiency without damaging the surface of wafer 110. In some embodiments, in response to the pressure being below 0.001 kg/cm$^2$, pressure sensor 157 can be configured to send a request signal to increase a cleaning time or increase the pressure applied by cleaning brush 150 against wafer 110. In some embodiments, in response to the pressure being above 0.05 kg/cm$^2$, pressure sensor 157 can be configured to send a request signal to reduce the pressure applied by cleaning brush 150 against wafer 110.

In some embodiments, cleaning brush 150 can further include a location sensor 159 configured to track the location of cleaning brush 150 on wafer 110. Location sensor 159 can transmit real-time location of cleaning brush 150 on wafer 110 to a control unit (not shown in FIG. 1) to ensure that cleaning brush 150 covers the entire surface of wafer 110. In some embodiments, real-time location of cleaning brush 150 can be transmitted by a wired communication means or a wireless communication means (e.g., a radio frequency (RF) transmitter, or a Bluetooth (BT) transmitter).

In some embodiments, wafer cleaning apparatus 100 can further include one or more sensors (not shown in FIG. 1) configured to detect one or more attributes associated with wafer 110, for example, in real time. In some embodiments, the sensor can be an infrared (IR) sensor or any other suitable sensor that can detect temperature of wafer 110 (e.g., in real time). In some embodiments, the sensor can be a camera or any other suitable sensor that can generate images in various wavelength ranges at the front surface and/or back surface of wafer 110, for example, in real time. The outputs of the sensors can be manually observed and analyzed by an operator and/or automatically received by an analyzing system for processing (e.g., to identify abnormal conditions). The number of sensors used for (e.g., real-time) monitoring of wafer cleaning condition is not limited. In some embodiments, a single sensor can be applied to monitor a single attribute or multiple attributes associated with wafer 110. In some embodiments, additional sensor(s) can be used to monitor attributes associated with other units in wafer cleaning apparatus 100, such as but not limited to, oxygen concentration in enclosure 105, humidity in enclosure 105, and a level of contamination in enclosure 105 to ensure safety and/or manufacturing quality.

In some embodiments, wafer cleaning apparatus 100 can further include an exhaust unit 108 configured to expel a vapor generated from the cleaning fluid inside enclosure 105. Exhaust unit 108 can be installed through one or more openings 106 at the ceiling, one of the vertical walls, or the floor of enclosure 105. In some embodiments, exhaust unit 108 can include a duct located on the vertical walls of enclosure 105 to form a passageway for the cleaning fluid vapor to exit enclosure 105 of wafer cleaning apparatus 100. The duct can be coated with adsorption materials, such as activated carbon, for adsorbing the cleaning fluid vapor passing through duct. In some embodiments, exhaust unit 108 can include a rinse nozzle configured to generate a mist and to rinse the cleaning fluid vapor passing through duct with mist. A vapor concentration can be reduced by mist from the rinse nozzle. In some embodiments, the mist can be formed by the rinse nozzle by mixing a fluid and an inert gas, in which the mixture can have a greater vapor adsorbing ability than a liquid rinse alone.

Figure 2:
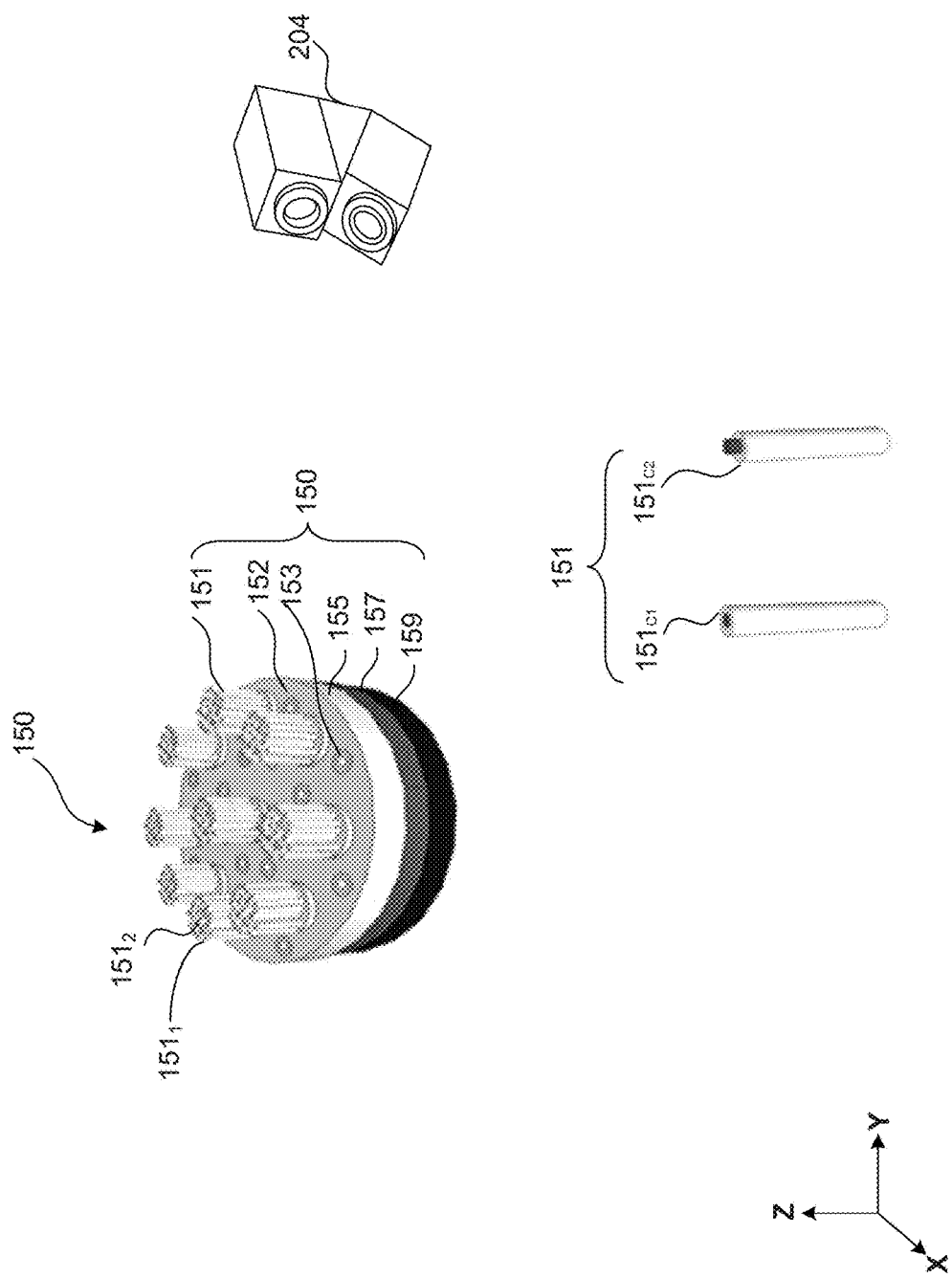
FIG. 2 is a diagram of an exemplary cleaning brush and an image sensor, in accordance with some embodiments.

FIG. 2 is a diagram of an exemplary cleaning brush 150 and an image sensor 204 configured to monitor cleaning brush 150, in accordance with some embodiments. The discussion of elements with the same annotations in FIGS. 1 and 2 applies to each other unless otherwise mentioned. Each bristle 151 can be coated with a coating layer $151_C$ configured to indicate wear of each bristle 151. In some embodiments, coating layer $151_C$ can be a color changing wear indicator. The color changing wear indicator can be characterized in that as the period of use of cleaning brush 150 progresses, the color of the wear indicator changes so that, when a predetermined color of the wear indicator is reached (e.g., the color red), this indicates that the recommended period of use for cleaning brush 150 has been reached. At this point, plurality of bristles 151 or cleaning brush 150 can be replaced. In some embodiments, the materials of plurality of bristles 151 can include, but is not limited to, polyethylene terephthalate (PET), polypropylene (PP), polyvinyl chloride (PVC), polyamide (PA), or a combination thereof. In some embodiments, the materials for coating layer 151 can include, but is not limited to, poly (methyl methacrylate) (PMMA), or acrylonitrile butadiene styrene (ABS). Coating layer $151_C$ can have a different color (e.g., white) than the color of bristle 151 (e.g., red). Coating layer $151_C$ can have a lower wear resistance than that of bristle 151. After a period of use for cleaning brush 150, coating layer $151_C$ can be partially worn out showing a change of color. The color of bristle 151 can change from one color (e.g., the color white showing a completely covered coating layer $151_{C1}$) to another color (e.g., the color red showing a partially worn out coating layer $151_{C2}$). In some embodiments, image sensor 204 can be attached inside enclosure 105 and oriented toward cleaning brush 150 to monitor usage of plurality of bristles 151 by monitoring the color change.

Figure 3B:
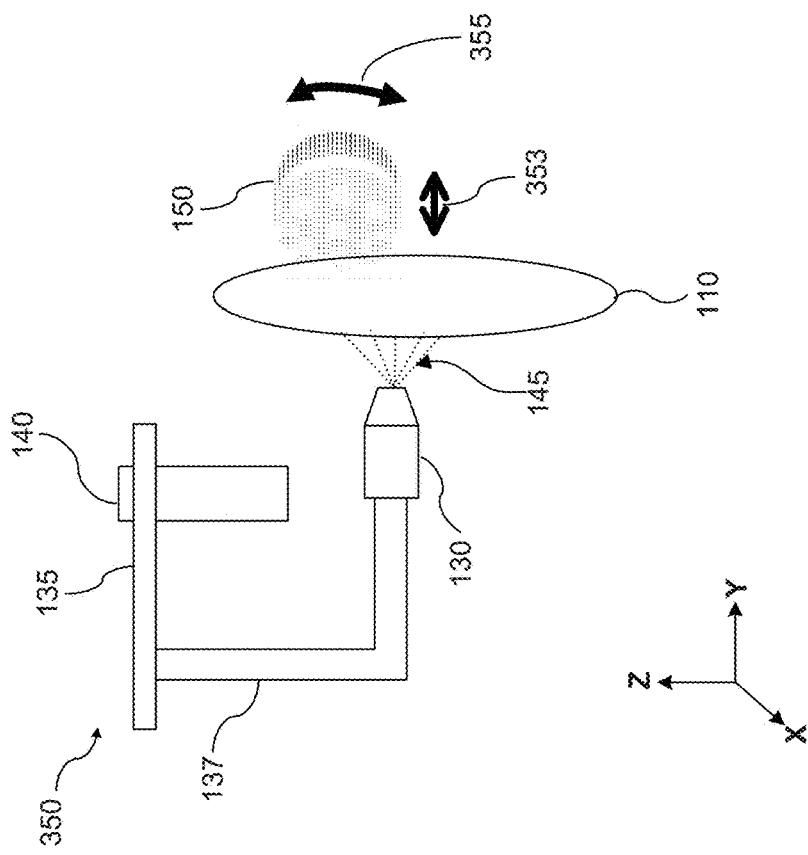
FIGS. 3A and 3B are diagrams of an exemplary wafer cleaning apparatus in different operation modes, in accordance with some embodiments.
Figure 3A:
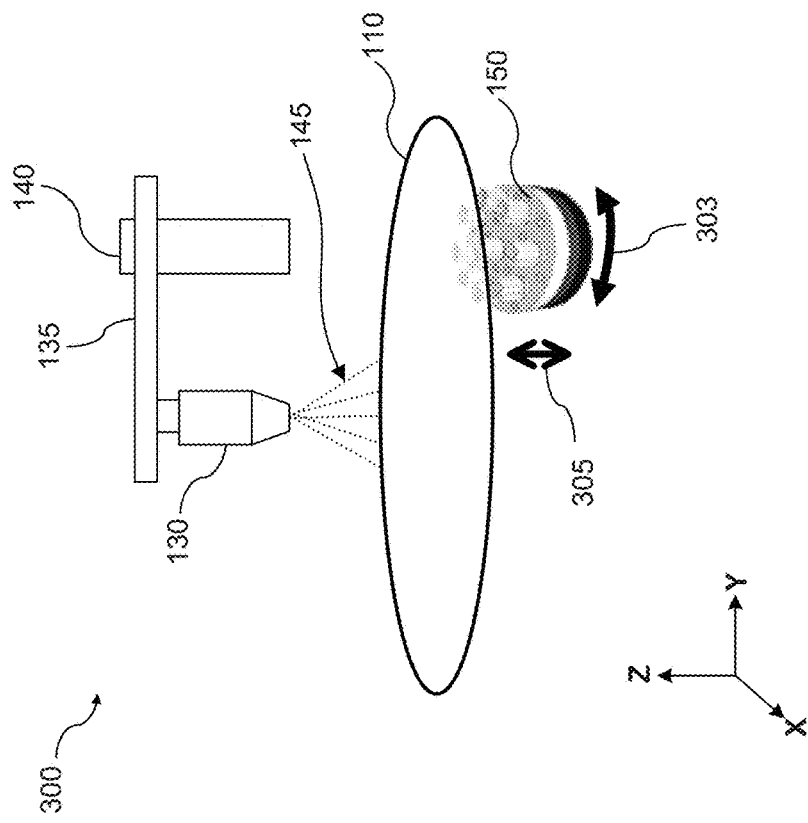

FIGS. 3A and 3B are diagrams of an exemplary wafer cleaning apparatuses 300 and 350 under different operation modes: a horizontal wafer orientation (FIG. 3A) and a vertical wafer orientation (FIG. 3B), in accordance with some embodiments. Each of wafer cleaning apparatuses 300 and 350 can be an embodiment of wafer cleaning apparatus 100. The discussion of wafer cleaning apparatus 100 can be applied to wafer cleaning apparatuses 300 and 350 unless mentioned otherwise. Further, the discussion of elements with the same annotations in FIGS. 1, 3A, and 3B applies to each other unless otherwise mentioned. In the horizontal wafer orientation mode, wafer 110's surface normal can be along the z-direction (e.g., along the gravitational direction), as shown in FIG. 3A. Therefore, in the horizontal wafer orientation mode, wafer holder 120 (shown in FIG. 1, not shown in FIGS. 3A and 3B) can be configured to hold or secure wafer 110 horizontally (e.g., wafer 110's surface can be along the x-y plane shown in FIG. 3A). In some embodiments, in the horizontal wafer orientation mode, cleaning brush 150 can be configured to vibrate along direction 305 (e.g., in the z-direction) using ultrasonic emitter 155 (not shown in FIG. 3A) and displace along direction 303 (e.g., along the x-y plane) to scrub and clean wafer 110. On the other hand, in the vertical wafer orientation mode, wafer 110's surface normal can be perpendicular to the z-direction (e.g., perpendicular to the gravitational direction). As a result, wafer holder 120 can be configured to hold or secure wafer 110 vertically (e.g., wafer 110's surface can be along the x-z plane shown in FIG. 3B), Further, as shown in FIG. 3B, wafer cleaning apparatus 100 can further include a connecting nozzle arm 137 configured to rotate cleaning nozzle 130 (e.g., rotating about the y-axis) to spray cleaning fluid 145 horizontally (e.g., in the y-direction) towards vertically (e.g., in the z-direction) oriented wafer 110. In some embodiments, connecting nozzle arm 137 can be configured to be rotational (e.g., about the y-axis) and translational (e.g., along the x-z plane; FIG. 3B) and spray cleaning fluid 145 via cleaning nozzle 130 towards vertically oriented wafer 110. In some embodiments, in the vertical wafer orientation mode, cleaning brush 150 can be configured to vibrate along direction 353 (e.g., in the y-direction) using ultrasonic emitter 155 (not shown in FIG. 3B) and displace along direction 355 (e.g., along the x-z plane) to scrub and clean wafer 110.

Figure 4:
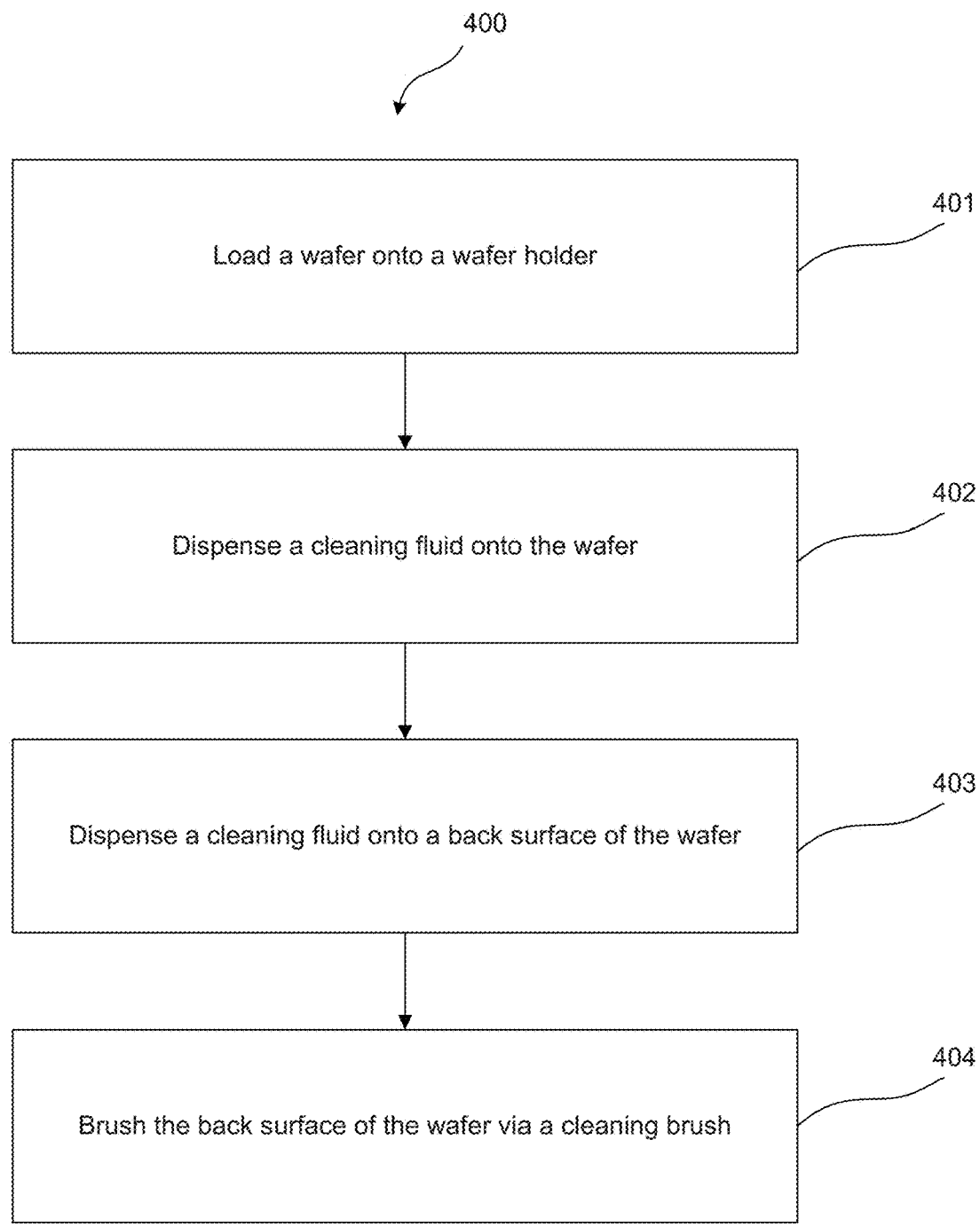
FIG. 4 is a flow chart of an exemplary wafer cleaning method, in accordance with some embodiments.

FIG. 4 is a flow chart of an exemplary wafer cleaning method 400, in accordance with some embodiments. Operations shown in method 400 are not exhaustive; other operations can be performed as well before, after, or between any of the illustrated operations. In some embodiments, operations of method 400 can be performed in a different order. Variations of method 400 are within the scope of the present disclosure.

In operation 401, a wafer (e.g., wafer 110) is loaded onto a wafer holder (e.g., wafer holder 120). For example, as shown in FIG. 1, the loading of the wafer can include placing the wafer on wafer holder 120. In some embodiments, the loading of the wafer can include heating the wafer by a heating plate of the wafer holder before or during a wafer cleaning process (e.g., operations 402-404 can be embodiments of the wafer cleaning process) to enhance a cleaning efficiency. In some embodiments, the loading of the wafer can include holding or securing the wafer on wafer holder 120 via multiple support pins (e.g., support pins 122) and multiple clamp pins (e.g., clamp pins 124) that can prevent the wafer from sliding during a wafer cleaning process (e.g., operations 402-404). The wafer holder can be configured to hold (or secure) the wafer horizontally (e.g., the wafer surface's normal can be along a gravitational direction, shown in FIG. 1) or vertically (e.g., the wafer surface's normal can be parallel to a gravitational direction, shown in FIG. 3B) during the wafer cleaning process. For example, the loading of the wafer can include horizontally (e.g., along the x-y plane of FIG. 1) placing the wafer on the wafer holder, securing the wafer on the wafer holder using one or more support pins and/or clamp pins, and rotating the wafer about 90 degrees to hold the wafer vertically (e.g., along the x-z plane of FIG. 1 and FIG. 3B).

In operation 402, a flow of a cleaning fluid (e.g., cleaning fluid 145) is supplied (or dispensed) onto the wafer (e.g., a wafer's front surface where semiconductor devices are formed) through a cleaning nozzle (e.g., cleaning nozzle 130). The cleaning fluid can include, but is not limited to, hydrofluoric acid, hydrochloric acid, sulfuric acid, hydrogen peroxide, ammonium hydroxide, acetone, methanol, isopropyl alcohol, deionized water (DI water), or a combination thereof. In some embodiments, a portion of an outer surface of the cleaning nozzle can be covered with a conductive layer (e.g., conductive layer 134), such as carbon nanotubes to reduce the static electric charge formed at the cleaning nozzle during operation. In some embodiments, the supply of the flow of the cleaning fluid can include attaching the cleaning nozzle to a nozzle arm (e.g., nozzle arm 135), and pivoting the nozzle arm around a spindle (e.g., spindle 140). In some embodiments, the supply of the flow of the cleaning fluid can include rinsing the front surface of the wafer with the cleaning fluid. In some embodiments, the rinsing the front surface of the wafer can be concurrently performed by pivoting the nozzle arm around the spindle. In some embodiments, the supply of the flow of the cleaning fluid can include forming a stream of the cleaning fluid via a pressure nozzle and injecting the stream of the cleaning fluid towards the front surface of the wafer (e.g., the cleaning nozzle can be a pressure nozzle to rinse of the wafer). Further, operation 402 can also include spinning the wafer on the wafer holder via a spin base (e.g., spin base 125) at different speeds and/or heating the wafer using the wafer holder. In some embodiments, the spinning and/or the heating of the wafer can be conducted concurrently with the supply of the cleaning fluid.

In operation 403, a cleaning fluid is dispensed (or sprayed) onto a back surface (e.g., backside) of the wafer through plurality of spray outlets (e.g., plurality of spray outlets 153) located on the cleaning brush (e.g., cleaning brush 150). The cleaning fluid for cleaning the back surface (e.g., backside) of the wafer in operation 403 can be made of the same or different chemicals as that for cleaning the front surface of the wafer (e.g., the cleaning fluid described in operation 402). In some embodiments, dispensing the cleaning fluid on the backside of the wafer can include rinsing the back surface of the wafer. In some embodiments, dispensing the cleaning fluid can include forming a stream of the cleaning fluid and directing the cleaning fluid through the spray outlets and towards the back surface of the wafer. In some embodiments, dispensing the cleaning fluid on the back side of the wafer can include heating the wafer using the wafer holder. In some embodiments, one or more operations described in operations 402 and 403 can be performed concurrently. In some embodiments, a portion of an outer surface of the spray outlets can be covered with a conductive layer (e.g., conductive layer 154) to reduce the risk of static electric charge.

In operation 404, the back surface (e.g., backside) of the wafer is brushed via the cleaning brush. For example, the back surface of the wafer can be brushed via cleaning brush 150, while the wafer can be placed or secured on wafer holder 120. In some embodiments, brushing the back side of the wafer via the cleaning brush can include applying a pressure to the cleaning brush against the back surface of the wafer, spinning the wafer, and rotating/displacing the cleaning brush (referred herein as "scrubbing mode") using a motion mechanism (e.g., a robotic arm or a motion stage) to scrub the wafer. In the scrubbing mode, the cleaning brush can be rotated at a rotational speed less than a threshold (e.g., about 2500 rpm) to ensure a stability control of the cleaning brush (e.g., the cleaning brush's motion stability). In some embodiments, in the scrubbing mode, the wafer can be stationary while the cleaning brush is rotating/displacing to scrub the wafer's back surface. In some embodiments, in the scrubbing mode, rotating the cleaning brush can include spinning the cleaning brush counterclockwise or clockwise. In some embodiments, in the scrubbing mode, rotating the cleaning brush can include interleaving a counterclockwise rotation of the cleaning brush with a clockwise rotation of the cleaning brush. Namely, rotating the cleaning brush can include alternately rotating the cleaning brush counterclockwise and clockwise.

In some embodiments, brushing the back side of the wafer can include contacting the back surface of the wafer with the cleaning brush, spinning the wafer, and vibrating the cleaning brush by, for example, an ultrasonic vibration device (referred herein as "vibration mode"). In the vibration mode, the ultrasonic vibration of the cleaning brush can be performed at a frequency between about 28 kHz and about 600 kHz. Vibrating the cleaning brush can include swinging the cleaning brush along the wafer's back surface's normal (e.g., vibrate the cleaning brush along in z-direction in FIG. 3A, or along the y-direction in FIG. 3B). In some embodiments, brushing the back side of the wafer via the cleaning brush can include performing both the scrubbing mode and the vibration mode on the wafer's back surface. In some embodiments, brushing the back side of the wafer can include concurrently performing one or more operations (e.g., applying the pressure or rotating the cleaning brush) previously described in the scrubbing mode and one or more operations (e.g., vibrating the cleaning brush) previously described in the vibration mode. In some embodiments, brushing the back surface of the wafer can include sequentially alternating between scrubbing mode and vibration mode.

In some embodiments, the cleaning fluid (e.g., cleaning fluid 145) can be concurrently supplied to the wafer (e.g., the wafer's front surface and/or back surface), while the wafer's back surface is brushed by the cleaning brush (e.g., one or more operations described in operation 404 can be performed concurrently with one or more operations described in operation 402 and/or operation 403.)

Further, in operation 404, brushing the back surface of the wafer via the cleaning brush can include detecting and adjusting a pressure of the cleaning brush against the wafer via a pressure sensor (e.g., pressure sensor 157). In some embodiments, the pressure to the cleaning brush against the wafer can be between about 0.001 and about 0.05 kg/cm² to maintain a cleaning efficiency without damaging the surface of the wafer. In some embodiments, if the detected pressure is above 0.05 kg/cm², the pressure sensor can send a request signal to a control unit to increase a separation between the cleaning brush and the wafer to reduce the pressure. In some embodiments, if the detected pressure is below 0.001 kg/cm², the pressure sensor can send a request signal to a control unit to decrease a separation between the cleaning brush and the wafer to enhance the pressure.

Further, in operation 404, the brushing of the back surface of the wafer can include tracking a location of the cleaning brush via a location sensor (e.g., location sensor 159). The location sensor can transmit (e.g., real-time) location of the cleaning brush to a control unit to ensure that the cleaning brush covers the entire back side surface of the wafer during the wafer cleaning process.

Further, in operation 404, brushing of the back surface of the wafer via the cleaning brush can include detecting a visual signature of the cleaning brush, comparing the detected visual signature to a baseline signature, and replacing the cleaning brush based on the comparison. In some embodiments, detecting the visual signature of the cleaning brush can include monitoring a color appearance of bristles associated with the cleaning brush using an image sensor (e.g., image sensor 204 in FIG. 2). The detected color appearance (e.g., the color of coating layer $151_{C2}$ of a worn cleaning brush shown in FIG. 2) can be compared to a baseline color signature of a qualified cleaning brush (e.g., the color coating layer $151_{C1}$ of a new cleaning brush shown in FIG. 2). If the comparison indicates the cleaning brush is worn out, the cleaning brush needs to be replaced. In some embodiments, detecting the visual signature, comparing the visual signature, and replacing the cleaning brush can be performed prior to the scrubbing mode and the vibration mode described previously (e.g., examine and replace the cleaning brush before starting to clean the wafer).

Various embodiments in accordance with the present disclosure provide an apparatus and a method for wafer cleaning in semiconductor device manufacturing. The apparatus can include a wafer holder configured to hold a wafer; a cleaning nozzle configured to dispense a cleaning fluid onto a first surface (e.g., front surface) of the wafer; and a cleaning brush configured to clean a second surface (e.g., back surface) of the wafer. The cleaning brush can clean a back surface of the wafer with scrubbing and ultrasonic vibration and with a cleaning fluid. Such apparatus and method can provide an enhanced and more effective cleaning to remove the defects from the wafer.

In some embodiments, an apparatus for wafer cleaning can include a wafer holder configured to hold a wafer; a cleaning nozzle configured to dispense a cleaning fluid onto a first surface of the wafer; and a cleaning brush configured to clean a second surface, opposite to the first surface, of the wafer. The cleaning brush can include a plurality of bristles and a plurality of spray outlets configured to dispense the cleaning fluid onto the second surface of the wafer. The apparatus can further include an enclosure configured to enclose the wafer holder, the cleaning nozzle and the cleaning brush.

In some embodiments, a method for cleaning a wafer can include loading the wafer onto a wafer holder, dispensing a cleaning fluid onto a surface of the wafer, spinning the wafer, and applying a pressure on the surface of the wafer via a cleaning brush and a motion mechanism.

In some embodiments, a method for cleaning a wafer is disclosed. The method can include loading the wafer onto a wafer holder; rinsing a first surface of the wafer by dispensing a cleaning fluid onto the first surface of the wafer; dispensing, with spray outlets on a cleaning brush, the cleaning fluid onto a second surface, opposite to the first surface, of the wafer; and cleaning, with the cleaning brush, the second surface of the wafer. In some embodiments, cleaning the second surface of the wafer can include applying a pressure to the cleaning brush against the wafer, rotating the cleaning brush and vibrating the cleaning brush.

It is to be appreciated that the Detailed Description section, and not the Abstract of the Disclosure, is intended to be used to interpret the claims. The Abstract of the Disclosure section can set forth one or more but not all exemplary embodiments contemplated and thus, are not intended to be limiting to the subjoined claims.

The foregoing disclosure outlines features of several embodiments so that those skilled in the art can better understand the aspects of the present disclosure. Those skilled in the art will appreciate that they can readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they can make various changes, substitutions, and alterations herein without departing from the spirit and scope of the subjoined claims.

What is claimed is:

1. A method for cleaning a substrate, comprising:
    loading the substrate on a holder, wherein a first surface of the substrate is separated from the holder;
    dispensing, via a spray outlet of a cleaning brush, a cleaning fluid onto a second surface of the substrate, the cleaning brush further comprising a plurality of bristles and a brush body, wherein the spray outlet comprises a conductive layer to reduce static electric charge, and wherein the conductive layer comprises carbon nanotubes; and
    scrubbing, by the plurality of bristles of the cleaning brush, the second surface of the substrate, wherein scrubbing the second surface comprises displacing the brush body with respect to a center of the substrate, and rotating the brush body.

2. The method of claim 1, wherein scrubbing the second surface further comprises vibrating the cleaning brush.

3. The method of claim 1, wherein rotating the brush body comprises rotating the brush body counterclockwise, clockwise, or counterclockwise and clockwise alternately at a rotational speed less than about 2500 rpm.

4. The method of claim 1, wherein scrubbing the second surface further comprises:
    detecting, by a pressure sensor, a first pressure to the cleaning brush against the substrate;
    determining that the first pressure is outside a threshold pressure range; and
    applying a second pressure, different from the first pressure, to the cleaning brush against the substrate, wherein applying the second pressure comprises moving the cleaning brush farther away from or closer to the substrate.

5. The method of claim 1, wherein loading the substrate comprises securing the substrate horizontally onto the holder, and wherein scrubbing the second surface comprises vertically moving the brush body in contact with the second surface.

6. The method of claim 1, wherein loading the substrate comprises securing the substrate vertically onto the holder and rotating the holder, and wherein scrubbing the second surface comprises horizontally moving the brush body in contact with the second surface.

7. The method of claim 1, wherein the holder comprises a heating plate, further comprising heating the substrate with the heating plate.

8. The method of claim 1, further comprising dispensing an other cleaning fluid onto the first surface of the substrate, wherein the other cleaning fluid comprises a different material from the cleaning fluid.

9. The method of claim 1, wherein the plurality of bristles comprises a first coating layer, further comprising:
    detecting, by an image sensor, an image of the plurality of bristles;
    comparing the image to a baseline image of a second coating layer of a plurality of bristles of an unused cleaning brush;
    determining a color change in the first coating layer of the plurality of bristles based on the comparison; and
    replacing the cleaning brush with the unused cleaning brush based on the determination.

10. The method of claim 1, further comprising determining, based on a location, an area of the second surface of the substrate that has been cleaned by the cleaning brush.

11. The method of claim 1, wherein the plurality of bristles have lengths different from each other.

12. The method of claim 1, wherein scrubbing the second surface further comprises: determining that a first pressure is below a threshold pressure range; and adjusting a time duration of scrubbing the second surface.

13. A method for cleaning a substrate, comprising:
    loading the substrate onto a holder, the substrate comprising front and back surfaces;
    dispensing a cleaning fluid on the back surface of the substrate through spray outlets of a cleaning brush, wherein each of the spray outlets comprises a conductive layer of carbon nanotubes;
    scrubbing, by a plurality of bristles of the cleaning brush, the back surface of the substrate by displacing a brush body of the cleaning brush with respect to a center of the substrate, and rotating the brush body;
    detecting, by an image sensor, a first color of a first coating layer surrounding sidewalls of the plurality of bristles; and
    replacing the cleaning brush with an unused cleaning brush in response to the first color being different from a second color of a second coating layer surrounding sidewalls of a plurality of bristles of the unused cleaning brush.

14. The method of claim 13, wherein top sidewall portions of the plurality of bristles of the cleaning brush are uncovered by the first coating layer in response to the first color being different from the second color.

15. The method of claim 13, further comprising comparing the first color of the first coating layer to the second color of the second coating layer.

16. The method of claim 13, further comprising:
    determining, by a sensor, a real-time location of the cleaning brush on the substrate; and
    determining, based on the real-time location, an area of the back surface of the substrate that has been cleaned by the cleaning brush.

17. A method for cleaning a substrate, comprising:
    loading the substrate onto a holder, the substrate comprising first and second surfaces;
    rinsing the first surface by dispensing, with a nozzle, a cleaning fluid onto the first surface of the substrate;
    dispensing, with spray outlets on a cleaning brush, the cleaning fluid onto the second surface, opposite to the first surface, of the substrate, the cleaning brush further comprising a plurality of bristles and a brush body, wherein the spray outlets comprise conductive layers of carbon nanotubes;

detecting, by an image sensor, a first color of a first coating layer of the plurality of bristles; and replacing the cleaning brush with an unused cleaning brush in response to the first color being different from a second color of a second coating layer of a plurality of bristles of the unused cleaning brush; and cleaning the second surface of the substrate, comprising:
  applying a pressure to the cleaning brush against the substrate; and
  scrubbing, by the plurality of bristles, the second surface of the substrate by displacing the brush body with respect to a center of the substrate and rotating the brush body.

18. The method of claim 17, further comprising:

tracking, by a sensor, a location of the cleaning brush on the substrate; and determining, based on the location, an area of the second surface of the substrate that has been cleaned by the cleaning brush.

19. The method of claim 17, wherein the nozzle comprises a conductive layer of carbon nanotubes to reduce static electric charge.

20. The method of claim 17, wherein the nozzle comprises a conductive layer comprising a carbon concentration between about 0.025 wt % and about 0.1 wt %.

\* \* \* \* \*